US009960750B2

(12) United States Patent
Srirattana et al.

(10) Patent No.: US 9,960,750 B2
(45) Date of Patent: *May 1, 2018

(54) APPARATUS FOR RECONFIGURABLE DIRECTIONAL COUPLERS IN AN RF TRANSCEIVER WITH CONTROLLABLE CAPACITIVE COUPLING

(71) Applicant: SKYWORKS SOLUTIONS, INC., Woburn, MA (US)

(72) Inventors: Nuttapong Srirattana, Billerica, MA (US); David Scott Whitefield, Andover, MA (US); David Ryan Story, Ladera Ranch, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/367,287

(22) Filed: Dec. 2, 2016

(65) Prior Publication Data

US 2017/0085245 A1 Mar. 23, 2017

Related U.S. Application Data

(63) Continuation of application No. 14/808,848, filed on Jul. 24, 2015, now Pat. No. 9,553,617.

(Continued)

(51) Int. Cl.
*H04B 1/40* (2015.01)
*H04B 7/155* (2006.01)
(Continued)

(52) U.S. Cl.
CPC .............. *H03H 7/463* (2013.01); *H01P 1/18* (2013.01); *H01P 5/18* (2013.01); *H01P 5/184* (2013.01);
(Continued)

(58) Field of Classification Search
CPC .... H04B 1/0458; H04B 1/40; H04B 7/15571; H04B 3/232; H04B 7/0619; H04B 2001/0408; H04B 17/13
See application file for complete search history.

(56) References Cited

U.S. PATENT DOCUMENTS 3,611,199 A 10/1971 Safran
3,868,594 A 2/1975 Cornwell et al.
(Continued)

FOREIGN PATENT DOCUMENTS

EP 2503701 A2 9/2012
JP S62-159502 A 7/1987
(Continued)

*Primary Examiner* — Andrew Wendell
(74) *Attorney, Agent, or Firm* — Lando & Anastasi, LLP

(57) ABSTRACT

Provided herein are apparatus and methods for reconfigurable directional couplers in an RF transceiver. Reconfigurable directional couplers can be reconfigured and designed to provide high directivity using configurable capacitors to effect a mutual coupling and using lumped components or delay lines to effect a phase shift. Depending on the embodiment, the reconfigurable directional coupler can include capacitors, inductors, and switching components. The coupler can be designed for multi-band operation with an adjustable coupling factor conducive to semiconductor process integration. The coupler can have variable phase shifters to achieve a desired level of directivity in the coupler.

24 Claims, 7 Drawing Sheets

Related U.S. Application Data

(60) Provisional application No. 62/028,747, filed on Jul. 24, 2014.

(51) Int. Cl.

| | | |
|---|---|---|
| *H04B 17/13* | (2015.01) | |
| *H03H 7/46* | (2006.01) | |
| *H04B 1/04* | (2006.01) | |
| *H01P 1/18* | (2006.01) | |
| *H01P 5/18* | (2006.01) | |
| *H03H 7/00* | (2006.01) | |
| *H03H 7/20* | (2006.01) | |

(52) U.S. Cl.
CPC ............. *H03H 7/004* (2013.01); *H03H 7/20* (2013.01); *H04B 1/0458* (2013.01); *H04B 1/40* (2013.01)

(56) References Cited

U.S. PATENT DOCUMENTS

| | | |
|---|---|---|
| 4,460,875 A | 7/1984 | Harman |
| 4,677,399 A | 6/1987 | Le Dain et al. |
| 4,764,740 A | 8/1988 | Meyer |
| 5,038,112 A | 8/1991 | O'Neill |
| 5,222,246 A | 6/1993 | Wolkstein |
| 5,276,411 A | 1/1994 | Woodin, Jr. et al. |
| 5,363,071 A | 11/1994 | Schwent et al. |
| 5,487,184 A | 1/1996 | Nagode |
| 5,625,328 A | 4/1997 | Coleman, Jr. |
| 5,745,016 A | 4/1998 | Salminen |
| 5,767,753 A | 6/1998 | Ruelke |
| 5,903,820 A | 5/1999 | Hagstrom |
| 6,020,795 A | 2/2000 | Kim |
| 6,078,299 A | 6/2000 | Scharfe, Jr. |
| 6,108,527 A | 8/2000 | Urban et al. |
| 6,329,880 B2 | 12/2001 | Akiya |
| 6,496,708 B1 | 12/2002 | Chan et al. |
| 6,559,740 B1 | 5/2003 | Schulz et al. |
| 6,771,141 B2 | 8/2004 | Iida et al. |
| 6,972,640 B2 | 12/2005 | Nagamori et al. |
| 7,042,309 B2 | 5/2006 | Podell |
| 7,236,069 B2 | 6/2007 | Puoskari |
| 7,305,223 B2 | 12/2007 | Liu et al. |
| 7,319,370 B2 | 1/2008 | Napijalo |
| 7,336,142 B2 | 2/2008 | Vogel |
| 7,493,093 B2 | 2/2009 | Boerman et al. |
| 7,538,635 B2 | 5/2009 | Fukuda et al. |
| 7,546,089 B2 | 6/2009 | Bellantoni |
| 7,966,140 B1 | 6/2011 | Gholson, III et al. |
| 8,175,554 B2 | 5/2012 | Camuffo et al. |
| 8,248,302 B2 | 8/2012 | Tsai et al. |
| 8,289,102 B2 | 10/2012 | Yamamoto et al. |
| 8,315,576 B2 | 11/2012 | Jones |
| 8,417,196 B2 | 4/2013 | Kitching et al. |
| 8,526,890 B1 | 9/2013 | Chien et al. |
| 8,606,198 B1 | 12/2013 | Wright |
| 8,633,761 B2 | 1/2014 | Lee |
| 8,761,026 B1 | 6/2014 | Berry et al. |
| 8,810,331 B2 | 8/2014 | Gu et al. |
| 9,014,647 B2 | 4/2015 | Kitching et al. |
| 9,214,967 B2 | 12/2015 | Reisner et al. |
| 9,356,330 B1 | 5/2016 | Donoghue et al. |
| 9,425,835 B2 | 8/2016 | Seckin et al. |
| 9,496,902 B2 * | 11/2016 | Srirattana ................ H04B 1/40 |
| 9,553,617 B2 * | 1/2017 | Srirattana ................ H04B 1/40 |
| 9,634,371 B2 | 4/2017 | Swarup et al. |
| 9,755,670 B2 | 9/2017 | Chen et al. |
| 2002/0097100 A1 | 7/2002 | Woods et al. |
| 2002/0113666 A1 | 8/2002 | Yamazaki et al. |
| 2002/0139975 A1 | 10/2002 | Lewis et al. |
| 2003/0214365 A1 | 11/2003 | Adar et al. |
| 2004/0127178 A1 | 7/2004 | Kuffner |
| 2004/0201526 A1 | 10/2004 | Knowles et al. |
| 2005/0017821 A1 | 1/2005 | Sawicki |
| 2005/0040912 A1 | 2/2005 | Pelz |
| 2005/0146394 A1 | 7/2005 | Podell |
| 2005/0170794 A1 | 8/2005 | Koukkari et al. |
| 2005/0239421 A1 | 10/2005 | Kim et al. |
| 2006/0232359 A1 | 10/2006 | Fukuda et al. |
| 2007/0159268 A1 | 7/2007 | Podell |
| 2008/0036554 A1 | 2/2008 | Krausse et al. |
| 2008/0055187 A1 | 3/2008 | Tamura et al. |
| 2008/0056638 A1 | 3/2008 | Glebov et al. |
| 2008/0070519 A1 | 3/2008 | Okabe |
| 2008/0112466 A1 | 5/2008 | Sasaki |
| 2009/0134953 A1 | 5/2009 | Hunt et al. |
| 2009/0195335 A1 | 8/2009 | Wahl et al. |
| 2009/0278624 A1 | 11/2009 | Tsai et al. |
| 2009/0280755 A1 | 11/2009 | Camuffo et al. |
| 2009/0322313 A1 | 12/2009 | Zhang et al. |
| 2011/0057746 A1 | 3/2011 | Yamamoto et al. |
| 2011/0063044 A1 | 3/2011 | Jones |
| 2011/0148548 A1 | 6/2011 | Uhm et al. |
| 2011/0199166 A1 | 8/2011 | Carrillo-Ramirez |
| 2011/0254637 A1 | 10/2011 | Manssen et al. |
| 2011/0279192 A1 | 11/2011 | Nash et al. |
| 2011/0298559 A1 | 12/2011 | Kitching et al. |
| 2012/0019332 A1 | 1/2012 | Hino et al. |
| 2012/0019335 A1 | 1/2012 | Hoang et al. |
| 2012/0062333 A1 | 3/2012 | Ezzeddine et al. |
| 2012/0071123 A1 | 3/2012 | Jones et al. |
| 2012/0243579 A1 | 9/2012 | Premakanthan et al. |
| 2013/0005284 A1 | 1/2013 | Dalipi |
| 2013/0113575 A1 | 5/2013 | Easter |
| 2013/0194054 A1 | 8/2013 | Presti |
| 2013/0207741 A1 | 8/2013 | Presti |
| 2013/0241668 A1 | 9/2013 | Tokuda et al. |
| 2013/0293316 A1 | 11/2013 | Kitching et al. |
| 2013/0307635 A1 | 11/2013 | Kase et al. |
| 2014/0152253 A1 | 6/2014 | Ozaki et al. |
| 2014/0266499 A1 | 9/2014 | Noe |
| 2014/0368293 A1 | 12/2014 | Mukaiyama |
| 2015/0002239 A1 | 1/2015 | Tanaka |
| 2015/0042412 A1 | 2/2015 | Imbornone et al. |
| 2015/0043669 A1 | 2/2015 | Ella et al. |
| 2015/0048910 A1 | 2/2015 | LaFountain et al. |
| 2015/0091668 A1 | 4/2015 | Solomko et al. |
| 2015/0200437 A1 | 7/2015 | Solomko et al. |
| 2015/0249485 A1 | 9/2015 | Ouyang et al. |
| 2015/0270821 A1 | 9/2015 | Natarajan et al. |
| 2015/0349742 A1 | 12/2015 | Chen et al. |
| 2015/0372366 A1 | 12/2015 | Frye |
| 2016/0025928 A1 | 1/2016 | Onawa |
| 2016/0028147 A1 | 1/2016 | Srirattana et al. |
| 2016/0028420 A1 | 1/2016 | Srirattana et al. |
| 2016/0043458 A1 | 2/2016 | Sun et al. |
| 2016/0065167 A1 | 3/2016 | Granger-Jones et al. |
| 2016/0079649 A1 | 3/2016 | Ilkov et al. |
| 2016/0079650 A1 | 3/2016 | Solomko et al. |
| 2016/0172737 A1 | 6/2016 | Srirattana et al. |
| 2016/0172738 A1 | 6/2016 | Srirattana et al. |
| 2016/0172739 A1 | 6/2016 | Srirattana et al. |
| 2016/0172740 A1 | 6/2016 | Srirattana et al. |
| 2016/0268994 A1 | 9/2016 | Granger-Jones et al. |
| 2016/0344430 A1 * | 11/2016 | Srirattana ................ H04B 1/40 |
| 2016/0344431 A1 * | 11/2016 | Srirattana ................ H04B 1/40 |
| 2017/0033428 A1 | 2/2017 | Ootsuka et al. |
| 2017/0063425 A1 | 3/2017 | Khlat et al. |
| 2017/0085245 A1 | 3/2017 | Srirattana et al. |

FOREIGN PATENT DOCUMENTS

| | | |
|---|---|---|
| JP | 2000-077915 A | 3/2000 |
| JP | 2013126067 A | 6/2013 |
| KR | 20040037465 A | 5/2004 |
| KR | 20110118289 A | 10/2011 |
| KR | 20120007790 A | 1/2012 |
| WO | 2005018451 A1 | 3/2005 |
| WO | 2015020927 A2 | 2/2015 |
| WO | 2015134979 A1 | 9/2015 |

* cited by examiner

APPARATUS FOR RECONFIGURABLE DIRECTIONAL COUPLERS IN AN RF TRANSCEIVER WITH CONTROLLABLE CAPACITIVE COUPLING

CROSS REFERENCE TO RELATED APPLICATIONS

This application is a continuation of and the claims the benefit under 35 U.S.C. § 120 of co-pending U.S. patent application Ser. No. 14/808,848 titled "APPARATUS AND METHODS FOR RECONFIGURABLE DIRECTIONAL COUPLERS IN AN RF TRANSCEIVER WITH CONTROLLABLE CAPACITIVE COUPLING" filed on Jul. 24, 2015, which claims priority to U.S. Provisional Application No. 62/028,747 filed on Jul. 24, 2014. Each of the above-identified Applications is incorporated by reference herein in its entirety for all purposes.

BACKGROUND

1. Field

Embodiments of the invention relate to radio frequency (RF) directional couplers, and more particularly, to reconfigurable directional couplers.

2. Description of the Related Technology

A directional coupler performs a variety of functions or operations relating to RF power signals. In one non-limiting example application a directional coupler is used to measure power delivered from a power amplifier. Power at the coupling port of the directional coupler is delivered to a power meter. Information from the power meter is used to adjust the power amplifier gain to a suitable level for amplifying a power signal of interest.

In another example application a directional coupler is adapted to monitor the transmitted power and the reflected power in a mobile phone antenna. From this information a power control circuit adjusts a power amplifier (PA) within the cell phone so as to improve a voltage standing wave ratio (VSWR).

SUMMARY

The aforementioned needs are addressed in one non-limiting embodiment which comprises a directional coupler for a power signal comprising: an input port; an output port that is connected to the input port via a first phase shifter; a coupled port that is connected to the input port via a first variable capacitive coupling element; an isolation port that is connected to the coupled port via a selectable phase shifter and is further connected to the output port via a second variable capacitive coupling element; and a processor that adjusts the first and second variable capacitive coupling elements to achieve a desired coupling level between the input port and the coupled port.

The aforementioned needs are also addressed in another non-limiting embodiment which comprises a directional coupler for a power signal, the directional coupler comprising a transmission path that includes an input port and an output port with a first phase shifter interposed therebetween; a coupled path that includes a coupled output port and an isolation port that has a second phase shifter interposed therebetween; a first variable capacitive coupling element that couples the input port on the transmission path to the coupled port on the coupling path; a second variable capacitive coupling element that couples the output port on the transmission path to the isolation port on the coupled path, the isolation port on the coupled path configured to receive a first signal from the transmission path and second variable capacitive coupling element and to receive a second signal from the first variable capacitive coupling element and the coupled path; and a processor that adjusts the first and second variable capacitive coupling elements to achieve a desired coupling level between the transmission path and the coupling path based at least in part on a characteristic of the power signal.

The aforementioned needs are also addressed in another non-limiting embodiment which comprises a wireless device for a power signal comprising: an antenna; a transceiver; a power amplifier that amplifies signals between the transceiver and the antenna; a coupler that receives the amplified signal from the power amplifier, the coupler having an input port that receives the signal from the power amplifier, an output port that provides a signal to the antenna and that is connected to the input port via a first phase shifter, a coupled port that is connected to the input port via a first variable capacitive coupling element and provides a coupled signal to a sensor, and an isolation port that is connected to the coupled port via a second phase shifter and is further connected to the output port via a second variable capacitive coupling element; and a processor that adjusts the first and second variable capacitive coupling elements to achieve a desired coupling level between the input port and the coupled port.

The aforementioned needs are satisfied in one non-limiting embodiment which comprises a directional coupler for a power signal comprising: an input port; an output port that is connected to the input port via a first selectable phase shifter; a coupled port that is connected to the input port via a first capacitive coupling element; an isolation port that is connected to the coupled port via a second selectable phase shifter and is further connected to the output port via a second capacitive coupling element; and a processor that adjusts the first and second selectable phase shifters based upon variations of the power signal to achieve a desired phase shift of the first and second signals received by the isolation port to achieve a desired directivity of the coupler the first and second capacitive coupling elements to achieve a desired coupling level between the input port and the coupled port.

The aforementioned needs are also satisfied in another non-limiting embodiment which comprises a directional coupler for a power signal, the directional coupler comprising: a transmission path that includes an input port and an output port with a first selectable phase shifter interposed therebetween; a coupled path that includes a coupled output port and an isolation port that has a second selectable phase shifter interposed therebetween; a first capacitive coupling element that couples the input port on the transmission path to the coupled port on the coupling path; a second capacitive coupling element that couples the output port on the transmission path to the isolation port on the coupled path, the isolation port on the coupled path configured to receive a first signal from the transmission path and second capacitive coupling element and to receive a second signal from the first capacitive coupling element and the coupled path; and a processor that adjusts the processor adjusts the first and second selectable phase shifters based upon variations of the power signal to achieve a desired phase shift of the first and second signals received by the isolation port to achieve a desired directivity of the coupler.

The aforementioned needs are also satisfied in another non-limiting embodiment which comprises a wireless device for a power signal comprising: an antenna; a transceiver; a power amplifier that amplifies signals between the transceiver and the antenna; a coupler that receives the amplified signal from the power amplifier, the coupler having an input port that receives the signal from the power amplifier, an output port that provides a signal to the antenna and that is connected to the input port via a first selectable phase shifter, a coupled port that is connected to the input port via a first capacitive coupling element and provides a coupled signal to a sensor, and an isolation port that is connected to the coupled port via a second selectable phase shifter and is further connected to the output port via a second capacitive coupling element; and a processor that adjusts the first and second selectable phase shifters based upon variations of the power signal to achieve a desired phase shift of the first and second signals received by the isolation port to achieve a desired directivity of the coupler.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
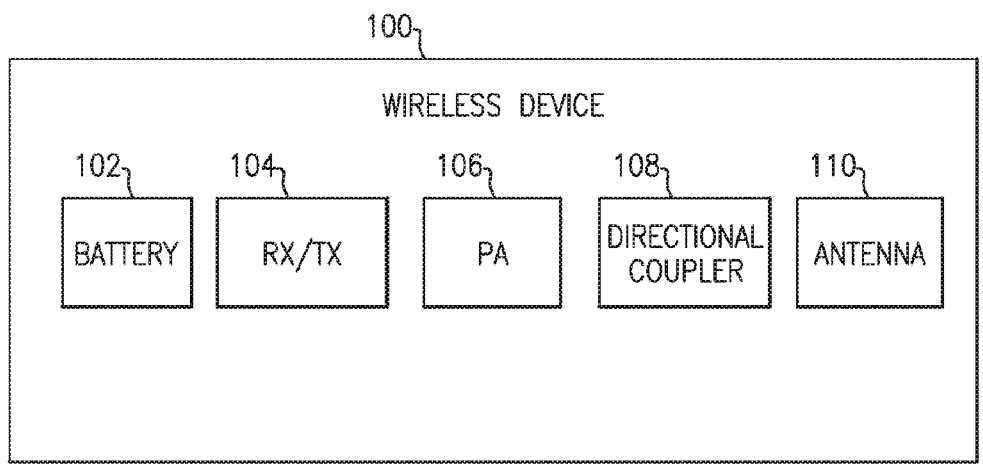
FIG. 1 is a schematic diagram of a wireless device having a reconfigurable directional coupler of the present disclosure.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

A directional coupler is a passive device which couples part of a transmitted signal such as a transmitted radio frequency (RF) power signal, by a known amount to another port. The coupled output from the directional coupler can be used to obtain information, such as frequency and power level, of the transmitted signal without interrupting the power flow. Common properties desired for all directional couplers are wide operational bandwidth, high directivity, and good impedance matching at all ports.

Directivity can be important for accurately measuring the output power of a power amplifier. For example, it can be important for the power measured using a coupling port of a directional coupler to track the output power of the power amplifier as the output load impedance of the amplifier varies. Improving the directivity of a directional coupler can improve the accuracy of power measurements required for power systems. For instance, accurate measurements are important for monitoring the transmitted and reflected power resulting from impedance mismatch of an antenna or other load.

A directional coupler is typically constructed using quarter-wavelength transmission lines or stripline placed in close proximity to form couplers. In this manner the coupling is based upon mutual inductance or inductive coupling, and the desirable properties become layout dependent. In this case the directivity depends upon line width, spacing, and distance between the two couplers. For relatively low frequency, coupler size can become large; and obtaining a relatively high inductive coupling can also lead to a relatively high parasitic, unwanted capacitance. The unwanted capacitance can degrade directivity. Therefore, it can be a design challenge to achieve a balance between having a high mutual coupling and a high directivity in a typical directional coupler using inductive coupling.

Accordingly, using directional couplers based upon inductive coupling can require large area and limit the minimum operating frequency and bandwidth. Therefore, there is a need for directional couplers using alternative coupling elements.

Disclosed herein are apparatus and methods for reconfigurable directional couplers. Reconfigurable directional couplers in accordance with embodiments described herein can be reconfigured and designed to address challenges associated with directional couplers, including fixed bandwidth issues, layout dependency, and issues due to large coupler size leading to problems in integrating couplers into the semiconductor process. Instead of relying on coupler inductive mutual coupling, which is layout dependent, reconfigurable directional couplers according to embodiments described herein can rely exclusively or primarily on capacitive coupling, phase addition, and/or phase cancellation to achieve coupling and directivity.

Depending on the embodiment, the coupler can include capacitors, inductors, and switching components. The coupler can be designed for multi-band operation, to have an adjustable coupling factor, and can have a reduced size that is conducive to semiconductor process integration. The couplers can include phase shift networks including delay line or L-C based networks.

FIG. 1 is a schematic diagram of a wireless device 100 having a reconfigurable directional coupler 108 of the present disclosure.

The wireless device 100 can be a cellular phone, smart phone, tablet, modem, communication network or any other portable or non-portable device configured for voice and/or data communication.

The wireless device 100 includes an antenna 110 that receives and transmits power signals and the reconfigurable directional coupler 108 that can use a transmitted signal for analysis purposes or to adjust subsequent transmissions. For example, the directional coupler 108 can measure a transmitted RF power signal from a power amplifier (PA) module 106 which can have one or more power amplifiers (PA's) to amplify signals from a transceiver 104. Additionally, the transceiver 104 can be configured to receive and transmit signals in a known fashion.

Figure 2:
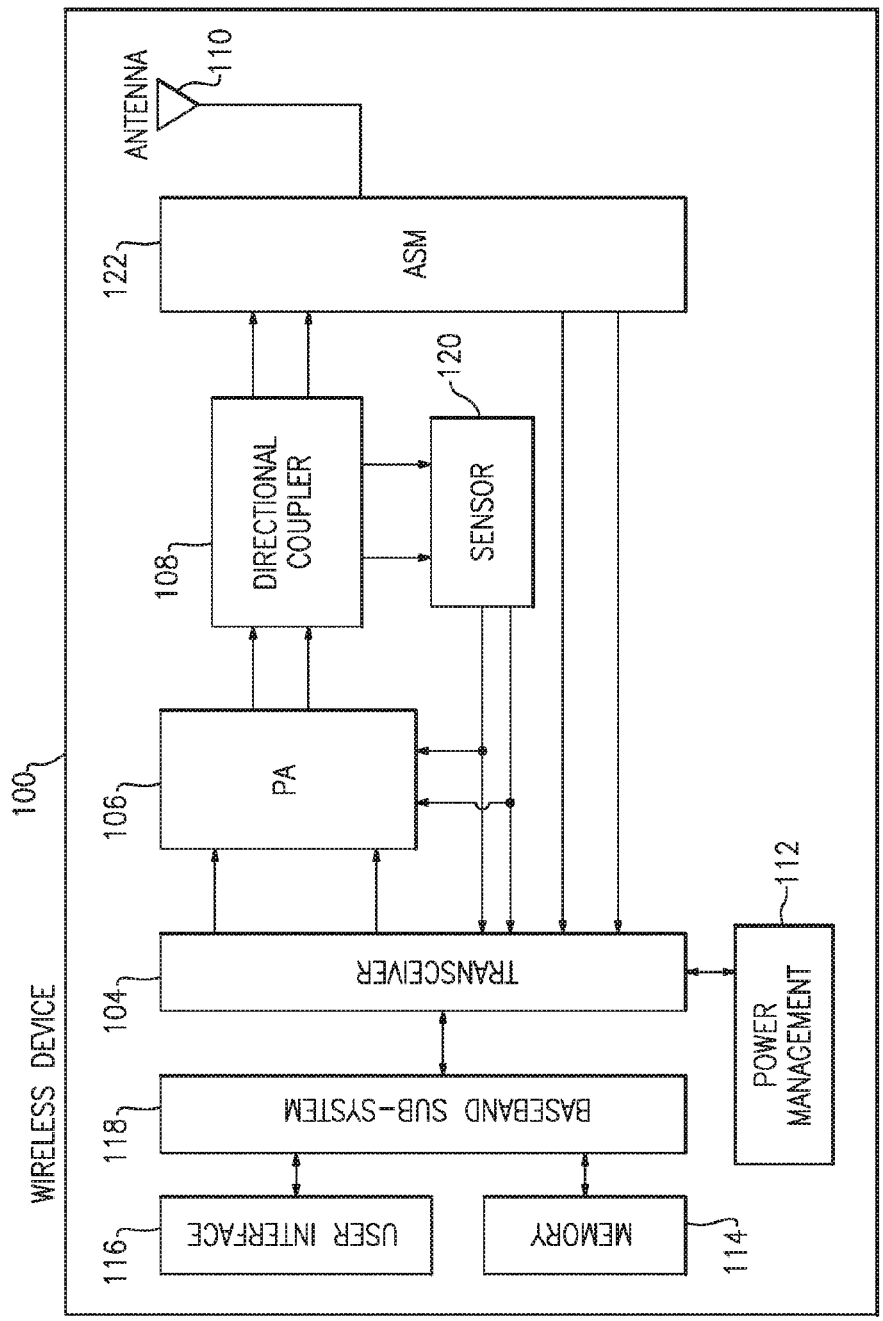
FIG. 2 is a schematic block diagram of an example wireless or network device that can include one or more of the modules of FIG. 1.

FIG. 2 is a schematic block diagram of an example wireless or network device that can include one or more of the modules of FIG. 1. FIG. 2 illustrates the wireless device 100 in greater detail. As shown, the wireless device 100 can receive and transmit signals from the antenna 110.

The transceiver 104 is configured to generate signals for transmission and/or to process received signals. Signals generated for transmission are received by the PA module 106 which can include one or more PA's to amplify one or more of the generated signals from the transceiver 104.

In some embodiments, such transmission and reception functionalities can be implemented in separate components (e.g. a transmit module and a receiving module), or be implemented in the same module. The antenna switch module 122 can be configured to switch between different bands and/or modes, transmit and receive modes etc. As is also shown in FIG. 2, the main antenna 110 both receives signals that are provided to the transceiver 104 via the antenna switch module 122 and also transmits signals from the wireless device 100 via the transceiver 104, the PA module 106 and the antenna switch module 122 in a known fashion.

The system of FIG. 2 further includes a power management system 112 that is connected to the transceiver 104 that manages the power for the operation of the wireless device. The power management system 112 can also control the operation of a baseband sub-system 118 and other components of the wireless device 100. The power management system 112 provides power to the wireless device 100 via the battery 102 in a known manner and includes one or more processors or controllers that can control the transmission of signals and can also configure the directional coupler 108 based upon the frequency of the signals being transmitted in the manner that will be described in greater detail below.

The baseband sub-system 118 is shown to be connected to a user interface 116 to facilitate various input and output of voice and/or data provided to and received from the user. The baseband sub-system 118 can also be connected to memory 114 that is configured to store data and/or instructions to facilitate the operation of the wireless device, and/or to provide storage of information for the user.

The PA module 106 can be used to amplify a wide variety of RF signals. For example, one or more power amplifiers (PA's) of the PA module 106 can receive an enable signal that can be used to pulse the output of the power amplifier to aid in transmitting a wireless local area network (WLAN) signal or any other suitable pulsed signal. Power amplifiers of the PA module 106 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

The power amplifier module 106 can further include one or more amplification paths including corresponding sets of power amplifiers. Each path can be dedicated to a different frequency band, for example. Each path may further include different sub-paths (e.g., low and high power amplification paths) which can be selected via corresponding sets of switches.

In certain embodiments, the power amplifiers and associated components including switches and the like can be fabricated on GaAs substrates using, for example, pHEMT or BiFET transistors, and the switches, power amplifiers, and bias control blocks associated with the die can be fabricated on a Silicon substrate using CMOS transistors.

As is also shown in FIG. 2, the wireless device 100 can also include a directional coupler module 108 having one or more reconfigurable directional couplers for measuring transmitted power signals from the PA module 106 and for providing one or more coupled signals to a sensor module 120. The sensor module 120 can in turn send information to the transceiver 104 and/or directly to the PA module 106 as feedback for making adjustments to regulate the power level of one or more power amplifiers of the PA module 106. In this way the directional coupler module 108 can be used to boost/decrease the power of an RF power signal having a relatively low/high power. It will be appreciated, however, that the coupler 108 can be used in a variety of implementations without departing from the spirit or scope of the present teachings.

When the wireless device 100 is a mobile phone having a time division multiple access (TDMA) architecture, the directional coupler module 108 can advantageously manage the amplification of an RF transmitted power signal from the PA module 106. In a mobile phone having a time division multiple access (TDMA) architecture, such as those found in Global System for Mobile Communications (GSM), code division multiple access (CDMA), and wideband code division multiple access (W-CDMA) systems, a PA from the PA module 106 can be used to shift power envelopes up and down within prescribed limits of power versus time.

For instance, a particular mobile phone can be assigned a transmission time slot for a particular frequency channel. In this case the PA module 106 can be employed to aid in regulating the power level one or more RF power signals over time, so as to prevent signal interference from transmission during an assigned receive time slot and to reduce power consumption. In such systems, the directional coupler module 108 can be used to measure the power of a power amplifier output signal to aid in controlling one or more power amplifiers of the PA module 106. The implementation shown in FIG. 2 is exemplary and should be non-limiting. For example, the implementation of FIG. 2 illustrates the directional coupler 108 being used in conjunction with a transmission of an RF signal; however, it will be appreciated that the directional coupler modules described below can also be used with received RF signals as well.

Figure 3:
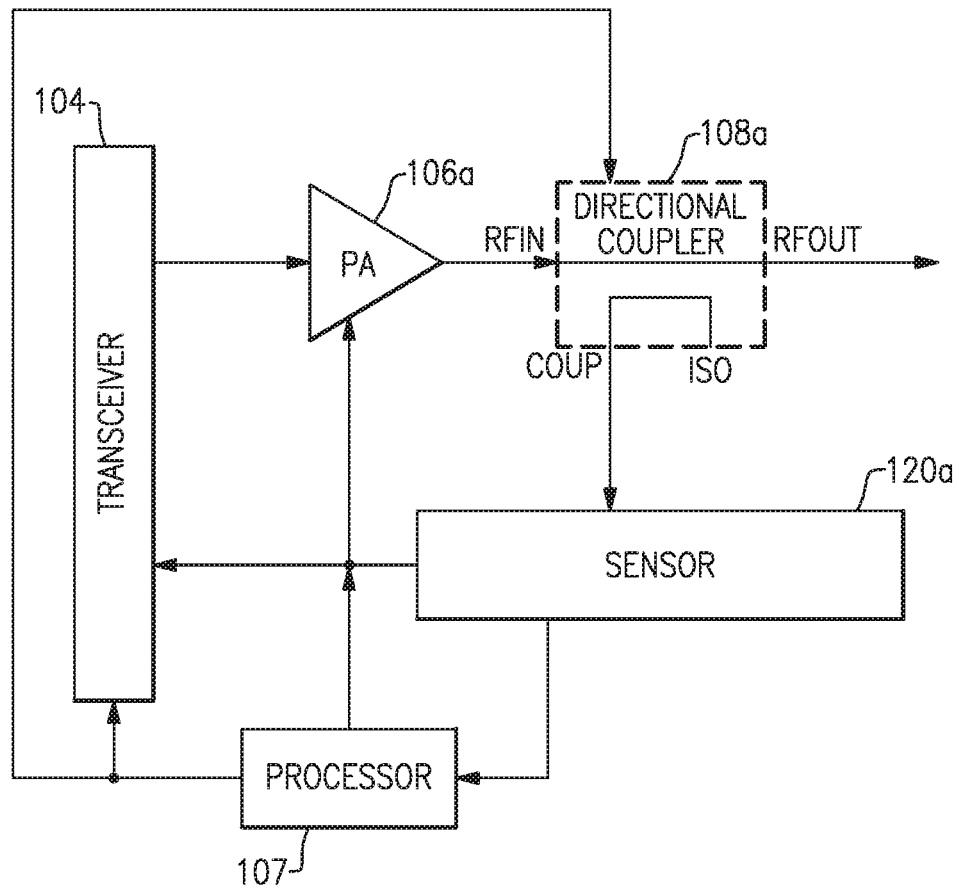
FIG. 3 is a schematic diagram a reconfigurable directional coupler and a sensor which can be used with a power amplifier.

FIG. 3 is a schematic diagram of a reconfigurable directional coupler 108a and a sensor 120a which can be used with a power amplifier 106a. In FIG. 3 the reconfigurable directional coupler 108a receives an RF transmitted power signal from the PA 106a at a power input port RFIN. The RF transmitted power signal from the PA 106a transmits along a power transmission path within the reconfigurable directional coupler 108a to a power output port RFOUT.

In addition the reconfigurable directional coupler 108a has a power coupling path which couples to a power signal of the power transmission path and provides a coupled RF power signal at a coupling port COUP and an isolated RF power signal at an isolation port ISO. The coupling between the power transmission path and the power coupling path is referred to as mutual coupling. A mutual coupling or mutual coupling factor of the reconfigurable directional coupler 108a is related to the ratio of the coupled RF power signal to the RF power signal at the power input port RFIN.

When the isolation port ISO is terminated with a matched impedance, then the coupled RF power signal can be larger than the isolated RF power signal. A directivity of the reconfigurable directional coupler 108a is related to the ratio of the coupled RF power signal to the isolated RF power signal and differentiates between forward and reverse travelling RF signals. The reconfigurable directional coupler 108a can be designed to have a large directivity with a large mutual coupling or mutual coupling factor. In this way the transmitted power signal at the power input port RFIN is accurately sensed by a power sensor 120a, and information from the power sensor 120a can be sent to the transceiver 104 and/or to the PA 106a to regulate the power level of the PA 106a.

As is also shown in FIG. 3, the reconfigurable directional coupler 108a receives signals from a processor 107 that can be part of the power management element 112 of the wireless device 100 or can comprise a separate element. The processor 107 receives signals from the sensor 120 and potentially elsewhere and changes the settings of the coupler 108a to achieve the desired directivity and coupling factor. It will be understood that, for example, signals that different frequency signals will require different levels of impedances to achieve the desired coupling factor and directivity and the components of the directional coupler 108a can be modified by the processor 107 in the manner that will be described in greater detail below.

Figure 4:
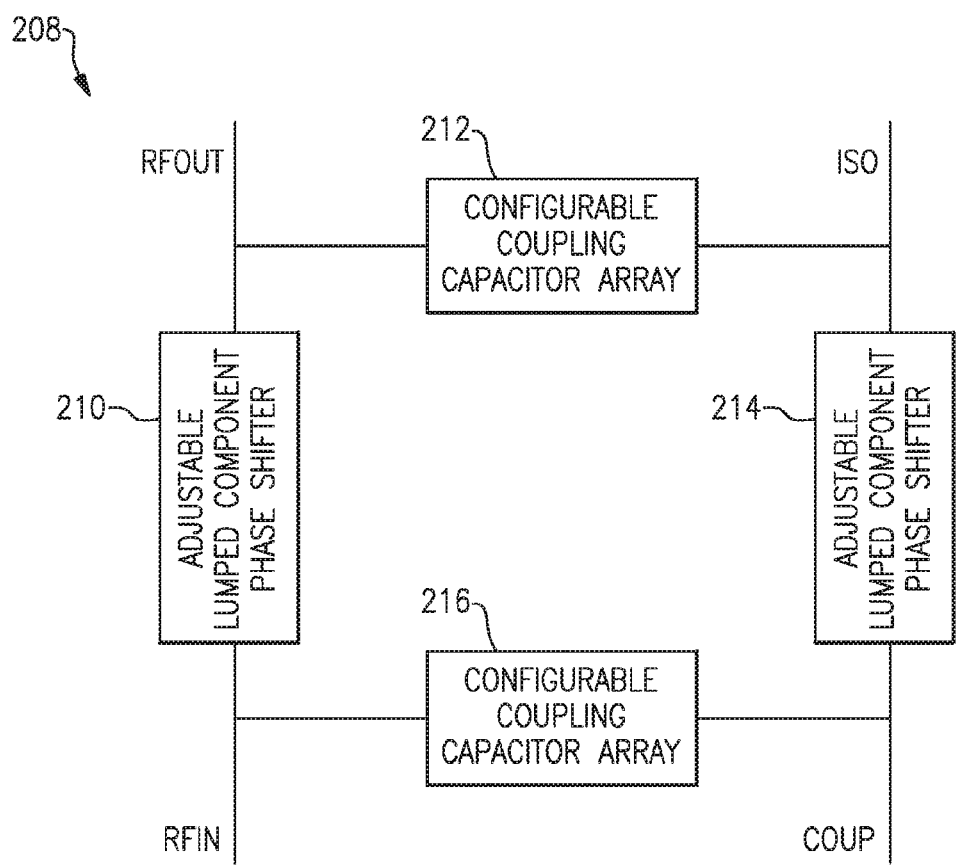
FIG. 4 is a schematic diagram of a reconfigurable directional coupler according to an embodiment of the present disclosure.

FIG. 4 is a schematic diagram of a reconfigurable directional coupler 208 according to an embodiment of the present disclosure. The reconfigurable directional coupler 208 has a first adjustable phase shifter 210 electrically connected between a power input port RFIN and a power output port RFOUT. A power signal entering the power input port RFIN transmits along a power transmission path delineated from the power input port RFIN to the power output port RFOUT. A power signal arriving at the power output port RFOUT is phase shifted by a first phase shift determined by the first adjustable phase shifter 210. The reconfigurable directional coupler 208 additionally has a second adjustable phase shifter 214 electrically connected between an isolation port ISO and a coupling port COUP. A power coupling path is delineated from the isolation port ISO to the coupling port COUP. In addition, a power signal arriving at the coupling port from the isolation port ISO is phase shifted by a second phase shift determined by the second adjustable phase shifter 214.

The reconfigurable directional coupler 208 further has a first configurable capacitor 216 electrically connected between the power input port RFIN and the coupling port COUP. The first configurable capacitor can be configured to provide a first mutual coupling between a power signal of the power input port RFIN and a power signal of the coupling port COUP. The first mutual coupling can be characterized by a first coupling coefficient relating to the value of capacitance of the first configurable capacitor.

Similarly, the reconfigurable directional coupler 208 has a second configurable capacitor 212 electrically connected between the power output port RFOUT and the isolation port ISO. The second configurable capacitor can be configured to provide a second mutual coupling between a power signal of the power output port RFOUT and a power signal of the isolation port ISO. The second mutual coupling can be characterized by a second coupling coefficient relating to the value of capacitance of the second configurable capacitor.

It will be appreciated that the RF coupler disclosed herein can, in some circumstances work bi-directionally. An example of this circumstance would be when the directional coupler is used to detect reverse transmit signals or reflected signals that may be emanating from the output side of the coupler 208. In this circumstance the output power port RFOUT would function as the input power port RFIN, the coupling port COUP would function as the isolation port ISO port and the input power port RFIN would function as the output power port RFOUT. The input power port RFIN or the isolation port ISO would then provide the reverse reflected signals for further processing. The phase shifters 210 and 214 and the coupler 212 and 216 could then be configured to provide the desired phase shifts of the sensed signals and the desired coupling in the manner that will be described hereinbelow. As such, the coupler 208 can be configured to receive two signals between two ports and provide corresponding coupled signals to a coupled port and an isolation port that will vary depending upon the direction of the signal. As such, the descriptions of input power port RFIN the output power port RFOUT Port, the coupling port COUP and the isolation port ISO can vary based upon the direction of the signal that is being received and should not be limited to the direction of the signal being transmitted on a power transmission path.

Figure 5:
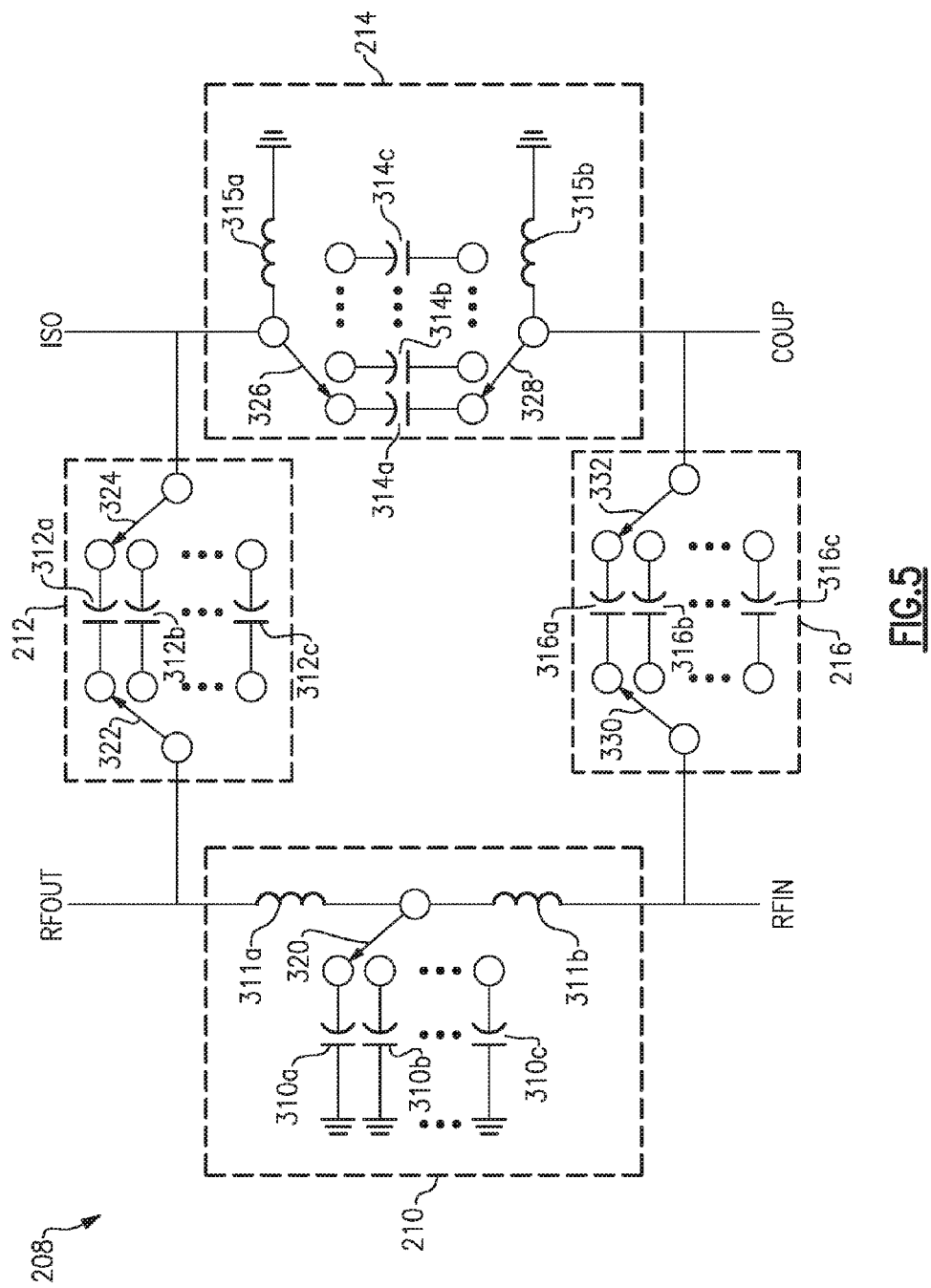
FIG. 5 is a schematic diagram of a reconfigurable directional coupler according to another embodiment of the present disclosure.

FIG. 5 is a schematic diagram of one implementation of a reconfigurable directional coupler 208 according to another embodiment of the present disclosure. In FIG. 5 more circuit details are shown. The first adjustable phase shifter 210 is an adjustable low pass tee network electrically connected between the power input port RFIN and the power output port RFOUT. The second adjustable phase shifter 212 is an adjustable high pass pi network electrically connected between the isolation port ISO and the coupling port COUP. The first configurable capacitor 216 is a switchable capacitor array electrically connected between the power input port RFIN and the coupling port COUP. And the second configurable capacitor 212 is a switchable capacitor array electrically connected between the power output port RFOUT and the isolation port ISO.

The first adjustable phase shifter 210 comprises a first inductor 311a and a second inductor 311b electrically connected in series between the power output port RFOUT and the power input port RFIN. The first adjustable phase shifter 210 also comprises a switchable capacitor array having a first capacitor 310a, a second capacitor 310b, and a third capacitor 310c. The first capacitor 310a, the second capacitor 310b, and the third capacitor are electrically connected between ground and a switching port of a single pole multi-throw switch 320 to allow selection of the capacitor value. The first inductor 311a and the second inductor 311b have fixed inductance values and are electrically connected together at a common node of the single pole multi-throw switch 320.

Having discrete or lumped components such as inductors and capacitors, the first adjustable phase shifter 210 can advantageously be adjusted to provide a specified value for the first phase shift when the RF power signal of the transmission path is of a given frequency band. Having more than one capacitor forming a capacitor array allows the first phase shift to be adjusted as a function of frequency and to be adjusted with low insertion loss (IL). Additionally, the size of the lumped components can be advantageously compact compared to stripline when the center frequency is relatively low.

Although the first adjustable phase shifter 210 shows the capacitor array as having three capacitors, the capacitor array can have a fewer or greater number of capacitors selected by the single pole multi-throw switch 320. Also, it can be appreciated by those practiced in the art of designing lumped element switchable arrays that the single pole multi-throw switch 320 can be realized in different ways. For instance, the single pole multi-throw switch 320 can be realized with more than one switch, and the switch can be a gate-controlled transistor such as an NFET (n-type field effect transistor) or PFET (p-type field effect transistor). Or alternatively, the switch can be realized using transmission gates. The switch 320 is, in one implementation, under the control of the processor 107 in a known manner.

The second adjustable phase shifter 214 comprises a first inductor 315a electrically connected between ground and a common node of a first single pole multi-throw switch 326 and a second inductor 315b electrically connected between ground and a common node of a second single pole multi-throw switch 328, for example, under the control of the processor 107. The first multi-throw switch 326 and the second multi-throw switch 328 can selectively connect one of a plurality of capacitors from a capacitor array comprising a first capacitor 314a, a second capacitor 314b, and a third capacitor 314c under, for example, the control of the processor 107.

Like in the first adjustable phase shifter 210, having an adjustable lumped element array of capacitors in the second adjustable phase shifter 214 offers advantages in selecting a frequency dependent specified value of the second phase shift. Also, as in the first adjustable phase shifter 210, the adjustable lumped element array can have fewer or greater capacitors while the first and second multi-throw switches can be realized using alternative connection schemes including using transmission gates or NFETs or PFETs.

The first configurable capacitor 216 is a switchable capacitor from a first capacitor array comprising a first capacitor 316a, a second capacitor 316b, and a third capacitor 316c. A first single pole multi-throw switch 330 having a common node electrically connected to the power input port RFIN and a second single pole multi-throw switch 332 having a common node electrically connected to the coupling port COUP can select one of the capacitors from the array.

The capacitor can be chosen from the array to provide a capacitance suitable for providing a first mutual coupling between a power signal of the power input port RFIN and a power signal of the coupling port COUP. In addition, the first single pole multi-throw switch 330 and the second single pole multi-throw switch 332 can be realized using alternative connection schemes including using transmission gates or NFETs or PFETs.

Similarly, the second configurable capacitor 212 is a switchable capacitor from a first capacitor array comprising a first capacitor 312a, a second capacitor 312b, and a third capacitor 312c. A first single pole multi-throw switch 322 under, for example the control of the processor 107 having a common node electrically connected to the power output port RFOUT and a second single pole multi-throw switch 324 having a common node electrically connected to the isolation port ISO can select one of the capacitors from the array.

The capacitor can be chosen from the array to provide a capacitance suitable for providing a second mutual coupling between a power signal of the power output port RFOUT and a power signal of the isolation port ISO. In addition, the first single pole multi-throw switch 322 and the second single pole multi-throw switch 324 can be realized using alternative connection schemes including using transmission gates or NFETs or PFETs.

While the first configurable capacitor 216 and the second configurable capacitor 212 show a first capacitor array and a second capacitor array having three capacitors, the first capacitor array and the second capacitor array can have fewer or greater capacitors.

Using capacitors instead of inductors to select the first and the second mutual coupling, the reconfigurable directional coupler 208 advantageously is space efficient while allowing the directivity to be adjusted based upon application. The desired characteristics can be attained first by selecting the first mutual coupling and the second mutual coupling to be large, and then second by selecting the first phase shift and the second phase shift for high directivity based upon the frequency band of interest.

FIGS. 6A-6D are schematic diagrams of alternative possible circuit configurations that can be used to achieve realizing the first adjustable phase shifter 210 and the second adjustable phase shifter 214 of FIG. 4.

Figure 6A:
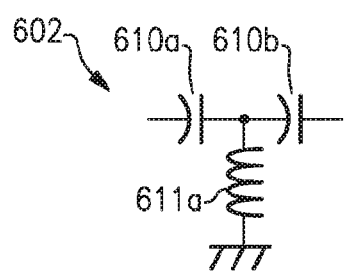
FIGS. 6A-6D are schematic diagrams of alternative embodiments for realizing a first phase shifter and a second phase shifter of FIG. 4.

FIG. 6A is a high pass tee network 602 comprising a first capacitor 610a, a second capacitor 610b, and an inductor 611a with a first node electrically connected to ground.

Figure 6B:
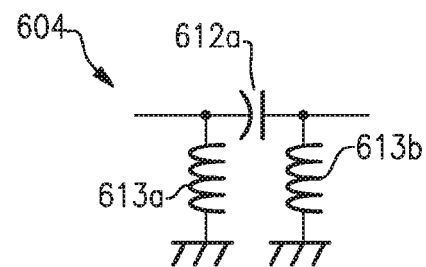

FIG. 6B is a high pass pi network 604 comprising a first inductor 613a with a first node electrically connected to ground, a second inductor 613b with a first node electrically connected to ground, and a capacitor 612a.

Figure 6C:
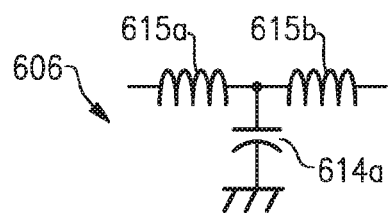

FIG. 6C is a low pass tee network 606 comprising a first inductor 615a, a second inductor 615b, and a capacitor 614a with a first node electrically connected to ground.

Figure 6D:
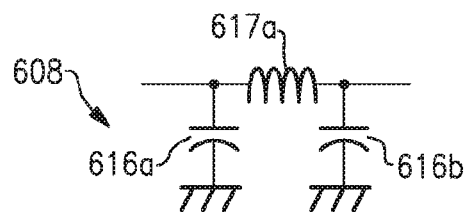

FIG. 6D is a low pass pi network 608 comprising a first capacitor 616a with a first node electrically connected to ground, a second capacitor 616b with a first node electrically connected to ground, and an inductor 617a. In implementation, there will be a plurality of different impedances arranged between either the transmission or coupled path and ground or in parallel that are connectable to the transmission path via a switch such as the switches 320 and 328 that can be controlled by the processor 107 (FIG. 3).

The embodiments of FIGS. 6A-6D can be used as adjustable networks for realizing the first adjustable phase shifter 210 and the first adjustable phase shifter 214 of FIG. 4 or FIG. 5. For instance, the low pass tee network 606 can be used to realize the first adjustable phase shifter 210 of FIG. 5 when the capacitor 614a is replaced with a switchable capacitor array. Similarly, the high pass tee network 604 can be used to realize the second adjustable phase shifter 214 of FIG. 5 when the capacitor 612a is replaced with a switchable capacitor array.

Figure 7:
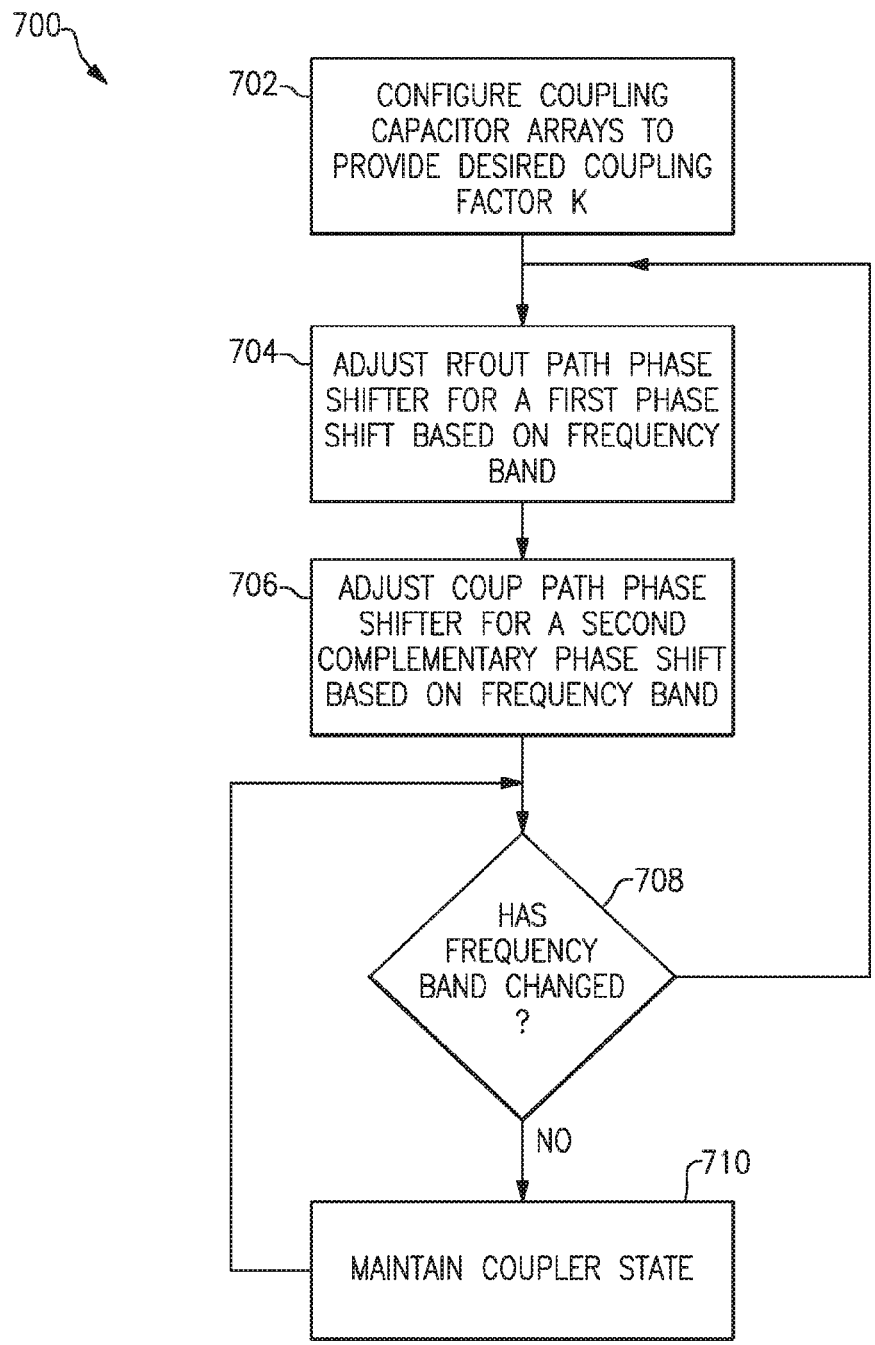
FIG. 7 is a flow diagram for configuring a reconfigurable directional coupler according to an embodiment of the present disclosure.

FIG. 7 is a flow diagram 700 for configuring a reconfigurable directional coupler according to an embodiment of the present disclosure. The flow diagram begins with a first configuration step 702 corresponding to selecting the first mutual coupling and the second mutual coupling.

The first mutual coupling and the second mutual coupling provide a desired coupling factor K which is related to the capacitance selected from the first capacitor array of the first configurable capacitor 216 and the second capacitor array of the second configurable capacitor 212 of FIG. 4 and FIG. 5.

Following this step, the frequency dependent components are adjusted in a second configuration step 704. Preferably, the frequency dependent components are adjusted so that the combined signal received at the ISO port a first path comprising RFIN to the adjustable lumped component phase shifter 210 and the configurable coupling capacitor array 212 and a second path comprising RFIN to the first configurable coupling capacitor array 216, the COUP port and the adjustable lumped component phase shifter 214 comprises two signals have phases that are offset from each other so that the combined signal at the ISO port is reduced in magnitude. In one specific implementation, the phase shifts on the paths are selected so that the signals at the ISO port are complementary to each other and can substantially cancel each other out. In these implementations, the phase is preferably selected so that the phase of the two signals from the two paths is approximately 180 degrees different.

For example, in the second configuration step 704 the first phase shift can be selected to provide approximately 90 degrees of phase shift between an RF power signal of the input power port RFIN and an RF power signal of the output power port RFOUT. This can correspond to selecting a switched discrete or lumped components such as inductors and capacitors from the first adjustable phase shifter 210, or alternatively to setting a delay of a delay line. The first phase shift is selected to be approximately 90 degrees for the frequency band of the RF power signal of the input power port RFIN and the RF power signal of the output power port RFOUT.

In a third configuration step 706, a similar adjustment is effected to provide approximately 270 degrees of phase shift between an RF power signal of the isolation port ISO and an RF power signal of the coupling port COUP. This corresponds to setting the second phase shift of the second adjustable phase shifter 214.

When the first mutual coupling and the second mutual coupling are commensurate, directivity becomes related to the first phase shift and the second phase shift. When the first phase shift and the second phase shift are complementary, having a sum equal to approximately 360 degrees as described above, then the directivity can be high.

Because the first phase shift and the second phase shift are frequency dependent, a decision step 708 is required. In the decision step 708 the RF power signal of the input port RFIN or of the output port RFOUT can be monitored to determine a frequency band of interest. If the frequency band changes, then the decision step 708 will repeat the second configuration step 704 and the third configuration step 706 to readjust the first phase shift and the second phase shift. If the frequency is stable, then the coupler maintains its present state and no changes are affected as shown in a fourth configuration step 710.

Applications

Devices employing the above described reconfigurable directional couplers can be implemented into various electronic devices. Examples of the electronic devices can include, but are not limited to, consumer electronic products, parts of the consumer electronic products, electronic test equipment, etc.

Such devices can include, but are not limited to, a mobile phone such as a smart phone, a telephone, a television, a computer monitor, a computer system, a modem, a hand-held computer, a laptop computer, a tablet computer, a personal digital assistant (PDA), a wearable computing device such as a smart watch, a healthcare monitoring device, an automobile, a stereo system, a radio, a camcorder, a camera, a digital camera, a portable memory chip, a wrist watch, a clock, etc. Further, the electronic devices can include unfinished products. Examples of the electronic devices can also include circuits of optical networks or other communication networks.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims. Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements.

Likewise, the word "connected," as generally used herein, refers to two or more elements that may be either directly connected, or connected by way of one or more intermediate elements.

Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively.

The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example" "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A reconfigurable directional coupler comprising:
a first adjustable phase shifter electrically connected between a power input port of the reconfigurable directional coupler and a power output port of the reconfigurable directional coupler;

a second adjustable phase shifter electrically connected between a coupled port of the reconfigurable directional coupler and an isolation port of the reconfigurable directional coupler;

a first configurable coupling capacitor array electrically connected between the power input port and the coupled port and having a first adjustable capacitance value;

a second configurable coupling capacitor array electrically connected between the power output port and the isolation port and having a second adjustable capacitance value; and a processor configured to adjust the first and second adjustable capacitance values to provide a desired mutual coupling factor between the power input port and the coupled port.

2. The reconfigurable directional coupler of claim 1 wherein the first adjustable phase shifter is configured to impart a first phase shift to a first signal travelling through the first adjustable phase shifter between the power input port and the power output port, and the second adjustable phase shifter is configured to impart a second phase shift to a second signal travelling through the second adjustable phase shifter between the isolation port and the coupled port, the first and second phase shifts being complementary and having a sum approximately equal to 360 degrees.

3. The reconfigurable directional coupler of claim 2 wherein the first phase shift is approximately 90 degrees and the second phase shift is approximately 270 degrees.

4. The reconfigurable directional coupler of claim 2 wherein the processor is configured to select the first and second phase shifts to provide a desired directivity of the reconfigurable directional coupler.

5. The reconfigurable directional coupler of claim 1 wherein the first adjustable phase shifter includes an adjustable low pass tee network.

6. The reconfigurable directional coupler of claim 5 wherein the first adjustable phase shifter includes a first inductor and a second inductor connected in series between the power input port and the power output port, and a switchable capacitor array connected from a node positioned between the first and second inductors to a ground.

7. The reconfigurable directional coupler of claim 5 wherein the second adjustable phase shifter includes an adjustable high pass tee network.

8. The reconfigurable directional coupler of claim 1 wherein the first adjustable phase shifter includes an adjustable low pass pi network.

9. The reconfigurable directional coupler of claim 8 wherein the second adjustable phase shifter includes an adjustable high pass pi network.

10. The reconfigurable directional coupler of claim 9 wherein the second adjustable phase shifter includes a switchable capacitor network connected between the isolation port and the coupled port and having a first node connected to the isolation port and a second node connected to the coupled port, the second adjustable phase shifter further including a first shunt inductor connected between the first node and a ground, and a second shunt inductor connected between the second node and the ground.

11. The reconfigurable directional coupler of claim 1 wherein the first configurable coupling capacitor array includes a pair of switches and a plurality of capacitors, the pair of switches being configured to selectively electrically connect at least one capacitor of the plurality of capacitors between the power input port and the coupled port.

12. The reconfigurable directional coupler of claim 10 wherein the pair of switches includes a first single-pole-multi-throw switch having a common node electrically connected to the power input port and a second single-pole-multi-throw switch having a common node electrically connected to the coupled port.

13. The reconfigurable directional coupler of claim 1 wherein the second configurable coupling capacitor array includes a pair of switches and a plurality of capacitors, the pair of switches being configured to selectively electrically connect at least one capacitor of the plurality of capacitors between the power output port and the isolation port.

14. The reconfigurable directional coupler of claim 13 wherein the pair of switches includes a first single-pole-multi-throw switch having a common node electrically connected to the power output port and a second single-pole-multi-throw switch having a common node electrically connected to the isolation port.

15. The reconfigurable directional coupler of claim 1 wherein the processor is configured to adjust the first and second adjustable capacitance values based on a frequency of an input signal received at the power input port.

16. A wireless device comprising:
a transceiver configured to produce a power input signal;
a power amplifier configured to receive and amplify the power input signal to provide an amplified power input signal;
a reconfigurable directional coupler having a power output port, a coupled port, an isolation port, and a power input port connected to the power amplifier, the reconfigurable directional coupler including a first adjustable phase shifter electrically connected between the power input port and the power output port, a second adjustable phase shifter electrically connected between the coupled port and the isolation port, a first configurable coupling capacitor array electrically connected between the power input port and the coupled port, and a second configurable coupling capacitor array electrically connected between the power output port and the isolation port, the reconfigurable directional coupler being configured to receive the amplified power input signal and capacitively couple signal power from the amplified power input signal to the coupled port to provide a coupled signal at the coupled port;
a sensor connected to the coupled port, the power amplifier, and the transceiver and configured to receive the coupled signal; and
a processor connected to the sensor, the power amplifier, the transceiver, and the reconfigurable directional coupler, the processor being configured to adjust capacitance values of the first and second adjustable capacitor arrays to provide a desired mutual coupling factor between the power input port and the coupled port.

17. The wireless device of claim 16 wherein the sensor is configured to provide power information to the power amplifier based on the coupled signal to adjust an amplification level of the power amplifier.

18. The wireless device of claim 16 wherein the processor is configured to adjust the capacitance values of the first and second adjustable capacitor arrays based on a frequency of the amplified power input signal.

19. The wireless device of claim 16 wherein the first adjustable phase shifter is configured to impart a first phase shift to the amplified power input signal.

20. The wireless device of claim 19 wherein the first adjustable phase shifter includes one of a low pass pi network and a low pass tee network each comprised of a first plurality of lumped components.

21. The wireless device of claim 20 wherein the second adjustable phase shifter is configured to impart a second phase shift to the coupled signal, the first and second phase shifts being complementary.

22. The wireless device of claim 21 wherein the processor is configured to select the first and second phase shifts to provide a desired directivity of the reconfigurable directional coupler.

23. The wireless device of claim 20 wherein the second adjustable phase shifter includes one of a high pass pi network and a high pass tee network each comprised of a second plurality of lumped components.

24. The wireless device of claim 16 wherein the first and second configurable coupling capacitor arrays each includes a plurality of switchable capacitors and a pair of switches configured to selectively connect at least one of the plurality of switchable capacitors.

* * * * *